United States Patent
Goto et al.

(10) Patent No.: US 8,336,196 B2
(45) Date of Patent: Dec. 25, 2012

(54) CONNECTOR ASSEMBLING JIG

(75) Inventors: Yuichi Goto, Yokkaichi (JP); Hidefumi Horiuchi, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 13/033,214

(22) Filed: Feb. 23, 2011

(65) Prior Publication Data

US 2011/0214283 A1    Sep. 8, 2011

(30) Foreign Application Priority Data

Mar. 3, 2010  (JP) ................................ 2010-046868

(51) Int. Cl.
*B23P 13/00*    (2006.01)

(52) U.S. Cl. ................. 29/747; 29/748; 29/736; 29/884; 439/752

(58) Field of Classification Search .................. 29/729, 29/739, 745–748, 592.1; 439/595, 71–74, 439/752
See application file for complete search history.

(56) References Cited

U.S. PATENT DOCUMENTS

| | | | |
|---|---|---|---|
| 5,701,079 A | 12/1997 | Yagi et al. | |
| 5,718,603 A | 2/1998 | Watanabe et al. | |
| 5,769,664 A * | 6/1998 | Saito et al. | 439/595 |
| 5,877,622 A | 3/1999 | Aoyama et al. | |
| 7,275,313 B2 * | 10/2007 | Ichida et al. | 29/747 |
| 7,299,541 B2 * | 11/2007 | Ikeda et al. | 29/747 |
| 2011/0214283 A1 * | 9/2011 | Goto et al. | 29/747 |

FOREIGN PATENT DOCUMENTS

JP    2000-147047    5/2000

* cited by examiner

*Primary Examiner* — Minh Trinh
(74) *Attorney, Agent, or Firm* — Gerald E. Hespos; Michael J. Porco (57) ABSTRACT

A connector assembling jig is used for a housing (20) that includes a main body (22) with terminal accommodating portions (21) and locking pieces (23) for locking terminal fittings (10) in the terminal accommodating portions (21) and in which each locking piece (23) projects from the main body (22) in an insufficient inserted state of the corresponding terminal fitting (10), and can detect insufficient insertion of the terminal fitting (10) when the terminal fitting (10) is inserted into the terminal accommodating portion (21). The connector assembling jig has a holder (30) including an accommodating recess (34) for the housing (20) and a detection arm (32) which is set to an insufficient insertion detecting posture when any locking piece (23) projects, and the accommodating recess (34) is formed with a positioning groove (68) for receiving a positioning rib (24) of the housing (20).

12 Claims, 10 Drawing Sheets

CONNECTOR ASSEMBLING JIG

BACKGROUND OF THE INVENTION

1. Field of the Invention

The invention relates to a connector assembling jig with a terminal insufficient insertion detecting function.

2. Description of the Related Art

Japanese Unexamined Patent Publication No. 2000-147047 discloses a connector assembling jig that is used to assemble terminal fittings into a housing and to detect a mounted state of the terminal fittings. The detecting function is to check whether a connector is assembled properly by confirming whether a separate retainer that locks the terminal fittings in the housing projects from a proper mount position. It is difficult to apply such a detecting function to a housing in which terminal fittings are locked without a retainer.

A connector assembling jig has been developed to detect proper insertion of terminal fittings into a housing that relies only on locking pieces to lock the terminal fittings. Locking pieces of the housing project from an outer surface of the housing if the terminal fittings have been inserted insufficiently. The connector assembling jig for this connector has a holder with an accommodating recess for accommodating the housing with the terminal fittings inserted therein. The connector assembling jig checks a proper mounted state of the terminal fittings by determining whether the locking pieces project from an outer surface of the housing when the housing is in the accommodating recess. However, a small clearance must be provided between the accommodating recess and the housing. Thus, the housing may shake laterally in the accommodating recess. Also, the housing may incline when the terminal fittings are inserted. Accordingly, the projecting amounts of the locking pieces may increase or decrease from a projecting amount that defines a detection standard and the insufficiently inserted states of the terminal fittings cannot be detected in a detecting portion.

A clearance between the accommodating recess and the housing becomes even larger if this connector assembling jig is used with a housing that has a smaller number of terminal fittings for common use, thereby leading to more shaking of the housing. Thus, a new and different connector assembling jig is necessary every time the number of terminal fittings is changed, which causes problems of increased production cost and poor production efficiency.

The invention was developed in view of the above situation and an object thereof is to provide an assembling jig which can improve accuracy of a detecting function by eliminating the shaking of a connector housing arranged in an accommodating recess and can be commonly used for connector housings with different numbers of terminal accommodating portions.

SUMMARY OF THE INVENTION

The invention relates to a connector assembling jig that is used with a housing that has a main body and at least one terminal accommodating portion. The housing also has at least one lock for retaining at least one terminal fitting that has been inserted to a proper position in the respective terminal accommodating portion. The lock projects out from one side surface of the main body when the corresponding terminal fitting is inserted insufficiently in the terminal accommodating portion. The connector assembling jig has a holder with an accommodating recess for accommodating and positioning the housing. An insufficient insertion detecting mechanism is provided in the holder and is set to an insufficient insertion detecting state when any lock of the housing projects out from the one side surface of the main body. At least one positioning groove is formed in the accommodating recess and receives at least one positioning rib that projects in a thickness direction of the housing. An inner surface of the positioning groove is substantially flush and continuous with an inner side surface of the accommodating recess adjacent to the inner surface where the positioning groove is formed.

The positioning groove may extend substantially in an inserting direction of the housing from the opening edge of the accommodating recess.

The outer side surfaces of the housing and the positioning rib are in contact with the inner side surface where the positioning groove and the accommodating recess are flush and continuous to prevent the housing from inclining in a width direction and shaking. This flush continuous arrangement also ensures a large contact part with the housing and the outer side surface of the positioning rib as compared with the case where there is an angle between the inner side surfaces of the positioning groove and the accommodating recess. Therefore, shaking of the housing is prevented even more. Furthermore, the insertion of the positioning rib in the positioning groove enables a housing with fewer terminals to be assembled without the shaking.

At least one small connector assisting groove having the same shape as the positioning groove may be provided in a central part of the side surface of the accommodating recess where the positioning groove is formed. Thus, two small housings can be inserted simultaneously into the accommodating recess by inserting the positioning rib into the small connector assisting groove and terminal fittings can be assembled therein if each housing is dimensioned so that a side surface opposite the positioning rib is held in close contact with the inner side surface of the accommodating recess opposite the positioning groove when the small housing is inserted into the accommodating recess.

At this time, one small connector can be assembled without shaking by inserting the positioning rib of the small housing into the positioning groove of the accommodating recess. Another small connector can be assembled without shaking with the side surface of the other housing where the positioning rib is provided is held in close contact with the inner side surface of the accommodating recess opposite to the side surface with the positioning groove is by inserting the positioning rib into the small connector assisting groove.

The holder preferably is mounted slidably between a first position where the housing can be accommodated in a base portion that holds the holder and a second position where the terminal fittings can be inserted into the housing that is in the holder.

The insufficient insertion detecting mechanism preferably comprises a detection arm supported rotatably about a supporting shaft in the holder. The detection arm is displaceable between an insufficient insertion detecting posture and a non-detecting posture according a projecting state of the lock from the housing main body when the terminal fitting is inserted into the housing with the holder at the second position.

The connector assembling jig may further comprise a locking mechanism that is provided from the holder to the base for locking the holder at the second position when the detection arm is in the detecting posture. The locking mechanism enables the holder to slide toward the first position when the detection arm is in the non-detecting posture.

The detection arm is set to the insufficient insertion detecting posture depending on the projecting amount of the lock and locks the holder at the second position in the insufficiently inserted state of the terminal fitting. Thus, whether the terminal fittings have been inserted completely into the housing can be judged by confirming whether the holder is slidable to the first position after the terminal fittings are inserted into the housing without separately checking assembled states of the terminal fittings. Further, the locking pieces and the housing will not be damaged since no external force on the locking pieces except a force for displacing the posture of the detection arm.

The detection arm preferably includes a locking-piece contact that can contact the locking piece and a locking-mechanism contact that acts on the locking mechanism depending on the detecting posture. A dimension from the supporting shaft to the locking-mechanism contact preferably exceeds a dimension from the supporting shaft to the locking-piece contact. According to this construction, the projecting amount of the locking piece in the insufficiently inserted state of the terminal fitting acts on the locking-mechanism contact portion after being multiplied. Thus, the insufficiently inserted state of the terminal fitting can be detected reliably even if the locking piece projects only by a small amount.

The locking mechanism preferably includes a lock that is in the holder and can slide in a direction crossing a sliding direction of the holder. The lock can be moved to a locking position for engaging an engaging recess in the base to lock the holder at the second position. The lock also can be moved to a non-lock position for disengaging the engaging recess and unlocking the holder. An unlock portion preferably is provided in the base and can slide in substantially the same direction as the holder. The unlock portion can be moved to an unlock position for contacting an unlock sliding portion at the leading end of the lock to slide the lock opposite to an engaging direction with the engaging recess, thereby disengaging the lock from the engaging recess. The unlock portion also can move to a locking position for holding the lock in the engaging recess. A stopper preferably is in the holder and can slide in substantially the same direction as the lock. The stopper can be moved to a restricting position for engaging an engaging groove in the base and to restrict the unlock portion at the locking position by being pushed by the detection arm when the detection arm is in the detecting posture. The stopper also can be moved to a non-restricting position to disengage the engaging groove and to free the unlock portion.

According to this construction, it is not necessary to fix the holder at the second position upon inserting the terminal fittings into the terminal accommodating portions, and whether all the terminal fittings have been completely inserted into the housing can be confirmed very easily based on whether the unlock portion is slidable.

A stopper biasing member preferably is supported on the stopper for biasing stopper toward a detection-arm accommodating groove of the holder.

The holder preferably includes a retaining portion for retaining the housing inserted in the holder when the holder is at the second position. According to this construction, the retaining portion retains the housing at the second position and the housing cannot be taken out in the insufficiently inserted state of the terminal fitting. This can prevent the housing from being erroneously taken out from the accommodating recess and can prevent damages of the housings and the locking pieces.

The positioning groove preferably has a depth that is less than about half of a thickness of the housing to be inserted into the accommodating recess, and the width of the positioning groove exceeds a depth of the positioning groove.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 8:
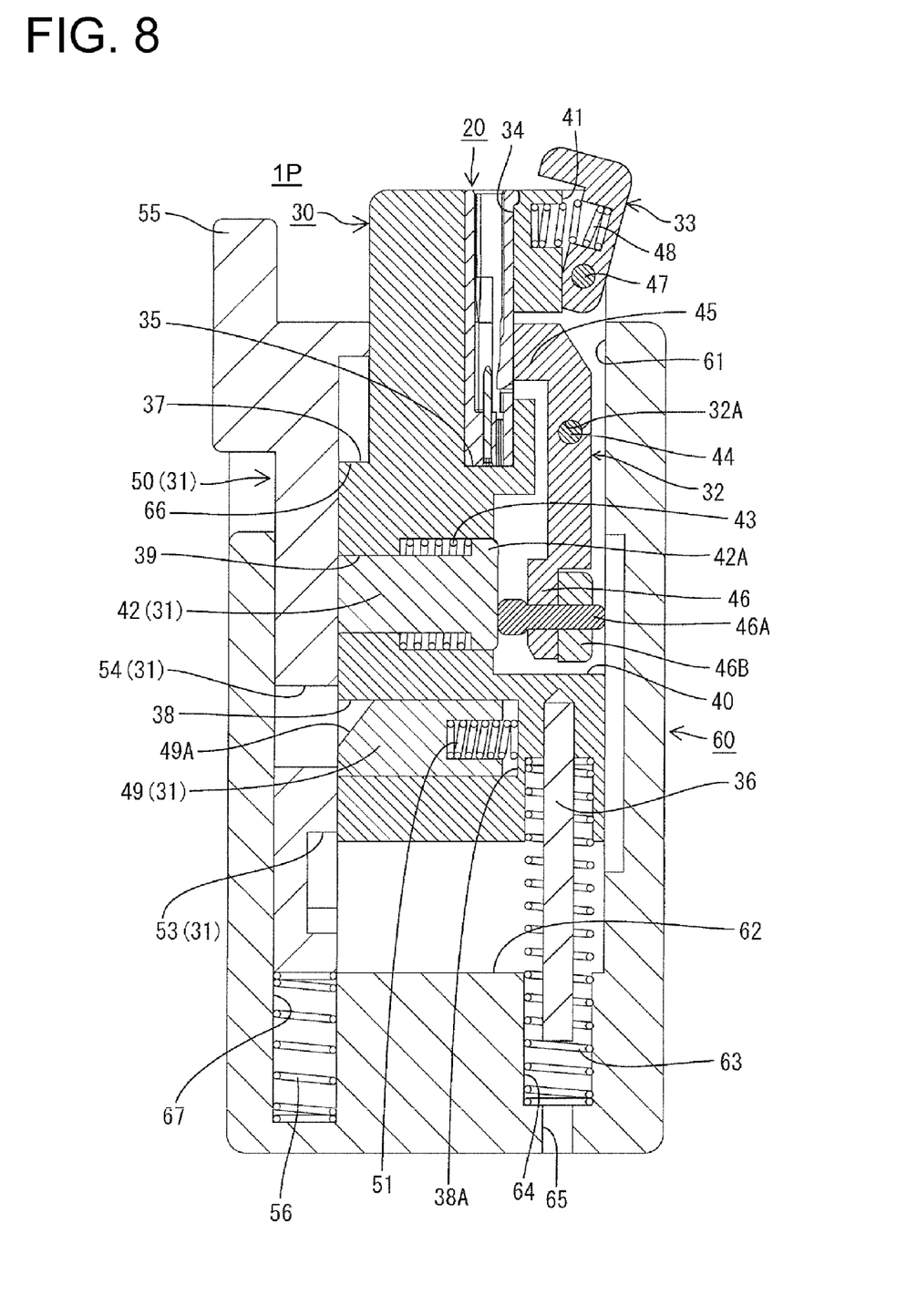
FIG. 8 is a side view in section showing a state where the connector housing is inserted into a holder located at a first position.

A connector assembling jig according to the invention has a substantially rectangular parallelepipedic box-like external appearance and, as shown in FIG. 8, includes a holder 30 for accommodating a housing 20 with terminal accommodating portions 21, a base 60 for holding the holder 30, a locking mechanism 31 provided from the holder 30 to the base 60, a detection arm 32 for detecting that a terminal fitting 10 is inserted insufficiently in the housing 20, and a retainer 33 for retaining the housing 20 in the holder 30. Vertical and lateral directions in the following description are based on those of FIG. 8, and an inserting direction of the housing is referred to as the front end.

As shown in FIGS. 1 to 4, the connector has a housing 20 made e.g. of synthetic resin and is formed with terminal accommodating portions 21 for receiving terminal fittings 10. The housing 20 includes a flat and substantially rectangular parallelepipedic main body 22 with locking pieces 23 for locking the terminal fittings 10 in the terminal accommodating portions 21.

Figure 1:
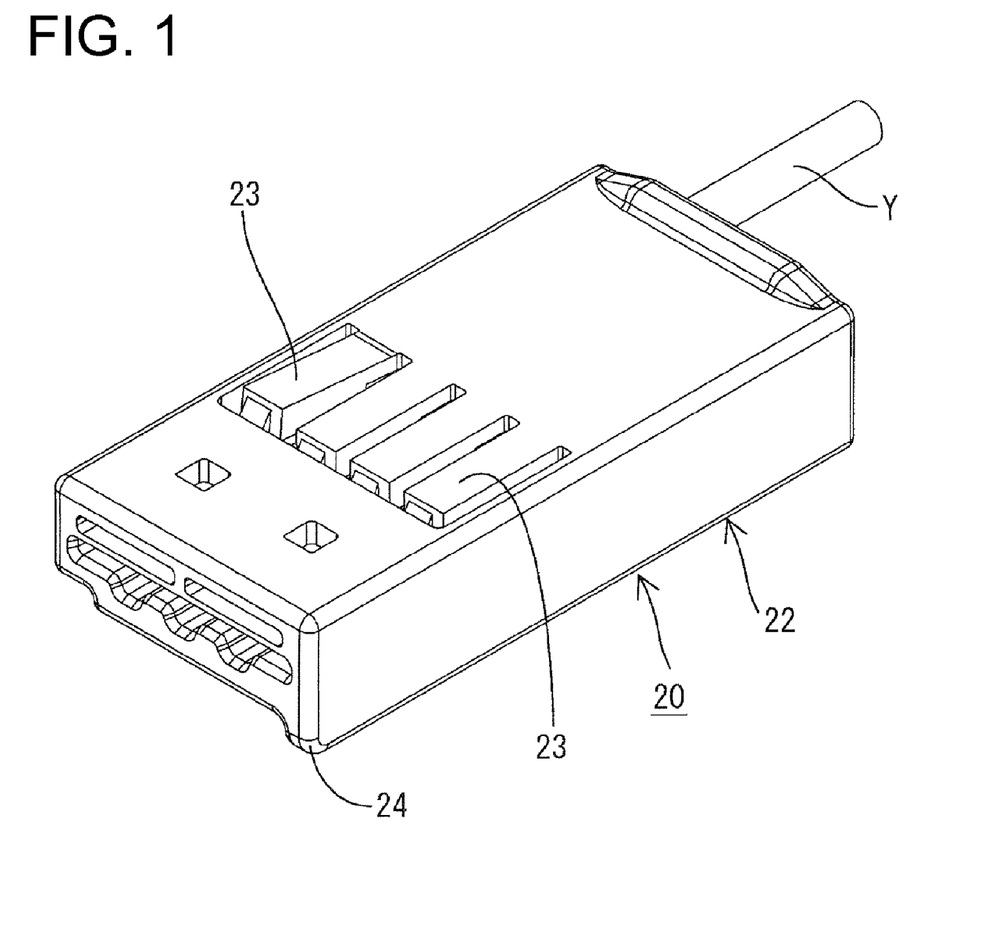
FIG. 1 is a perspective view of housing in which a terminal fitting is inserted.

The terminal accommodating portions 21 have open front and rear ends and are formed substantially side by side in the housing main body 22. The respective terminal fittings 10 can be accommodated into the terminal accommodating portions 21 from behind and unillustrated mating terminal fittings to be connected to the respective terminal fittings 10 can be inserted therein from the front. The locking pieces 23 are formed unitarily at one side surface of the housing main body 22 and are provided in each terminal accommodating portion 21. More particularly, substantially strip-like locking pieces 23 are formed substantially side by side to extend from a substantially middle part of the side surface of the housing main body 22 to positions near an intermediate position between the front end surface of the housing main body 22 and the central part.

Figure 2:
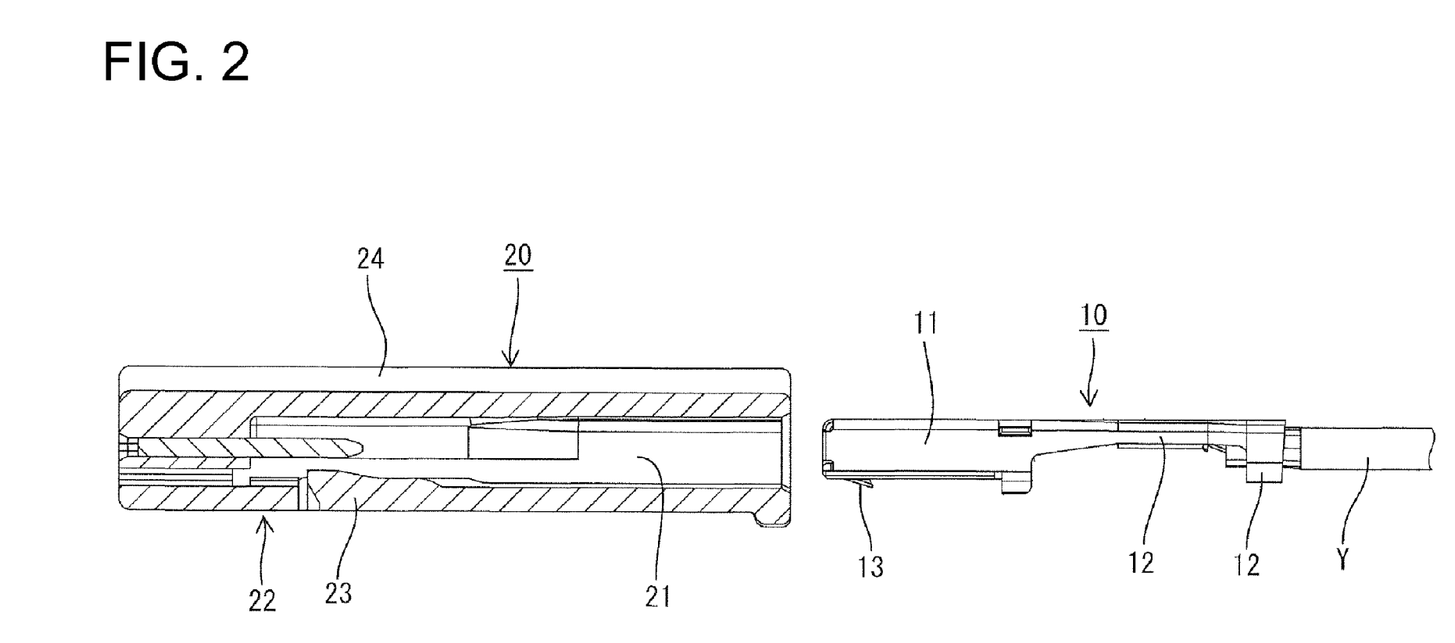
FIG. 2 is a side view in section showing the terminal fitting inserted into the housing.

As shown in FIG. 2, each terminal fitting has a rectangular tubular connecting portion 11 and a barrel 12 behind the connecting portion 11. The barrel 12 is to be crimped and connected to a wire Y. A locking claw 13 projects out on one of the outer surfaces of the connecting portion 11. The terminal fitting 10 is inserted into the terminal accommodating portion 21 of the housing 20 so that the surface with the locking claw 13 contacts a surface of the terminal accommodating portion 21 with the locking piece 23.

Figure 3:
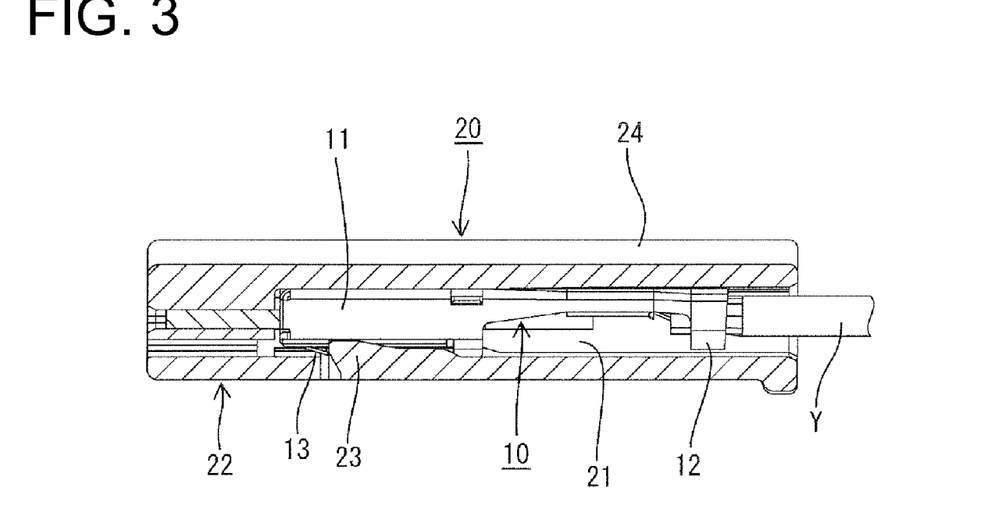
FIG. 3 is a side view in section showing the terminal fitting at a proper position.

Each locking piece 23 has a base end supported at the substantially central part of the housing main body 22 and resiliently deformable with the base end portion as a supporting. The locking piece 23 is pressed by the connecting portion 11 of the terminal fitting 10 when the terminal fitting 10 is inserted into the terminal accommodating portion 21. Thus, the locking piece 23 deforms out from the terminal accommodating portion 21 and a leading end portion of the locking piece 23 projects from the outer surface of the housing main body 22. The locking piece 23 resiliently returns when the terminal fitting 10 is inserted to a proper connection position and the locking claw 13 of the connecting portion 11 of the terminal fitting 10 engages the locking piece 23. As a result, the outer surfaces of the locking piece 23 and the housing main body 22 become substantially flush.

Figure 4:
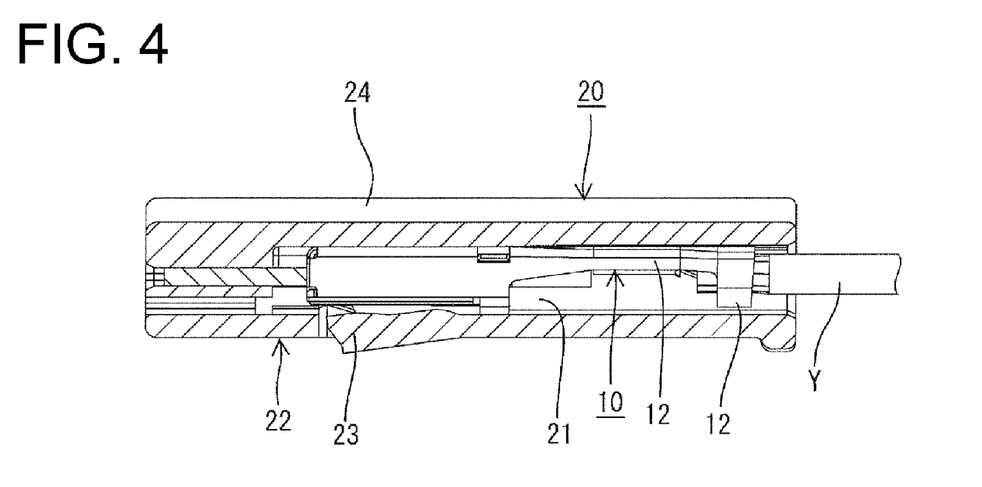
FIG. 4 is a side view in section showing the terminal fitting insufficiently inserted.

On the other hand, the locking claw 13 of the terminal fitting 10 presses the locking piece 23 if the terminal fitting 10 is inserted insufficiently in the terminal accommodating portion 21 so that the locking piece 23 projects out from one longer side surface of the housing main body 22, as shown in FIG. 4.

The holder 30 of the connector assembling jig has a substantially rectangular parallelepipedic box-like external appearance, and a substantially rectangular accommodating recess 34 is formed in a central part of the upper or outer surface of the holder 30 for accommodating the above-described housing 20. An opening of the accommodating recess 34 is formed such that opening edges along the longer sides substantially are parallel to longer outer surface portions of the holder 30.

This accommodating recess 34 has substantially the same cross-sectional shape from the opening to a bottom wall 35 thereof and can hold the housing 20 therein.

A length from the bottom wall 35 of this accommodating recess 34 to the opening particularly is set to be substantially equal to the length of the connector housing 20 in a terminal fitting inserting direction. When the housing 20 is inserted into the accommodating recess 34, the rear end surface of the housing 20 and a surface of the holder 30 where the opening is formed particularly become substantially flush.

Figure 5:
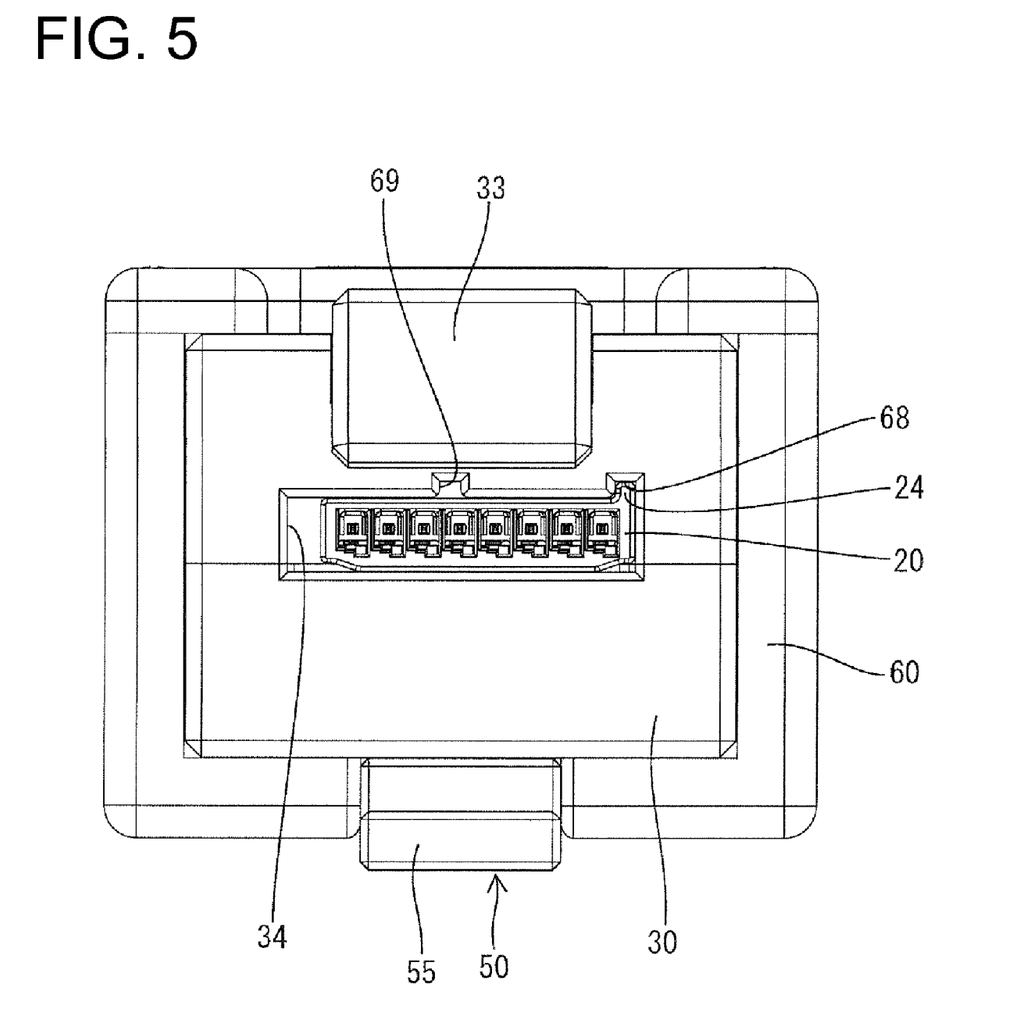
FIG. 5 is a front view showing a housing with eight terminal accommodating portions inserted in an accommodating recess of a connector assembling jig according to this embodiment.

Further, the length of the opening of the accommodating recess 34 along the shorter sides particularly is set to be substantially equal to the thickness of the connector housing 20. When the connector housing 20 is inserted into the accommodating recess 34, surfaces of the accommodating recess 34 along the longer sides and surfaces of the connector housing 20 along the longer sides substantially are held in close contact.

This holder 30 is at least partly covered by the base portion 60 which serves as an outer peripheral wall of the connector assembling jig.

The base portion 60 particularly has a substantially rectangular parallelepipedic external appearance and/or is internally formed with a holder accommodating portion 61 for at least partly accommodating the holder 30. The holder accommodating portion 61 is open in the same direction as the opening direction of the accommodating recess 34 of the holder 30 to be at least partly accommodated and/or has an opening with substantially the same rectangular shape formed by the outer circumferential surface of the holder 30. When the holder 30 is completely accommodated in the holder accommodating portion 61, the surface of the holder 30 where the accommodating recess 34 is formed and the surface of the base portion 60 where the holder accommodating portion 61 is formed particularly are substantially flush.

The holder 30 is slidable in the holder accommodating portion 61 between a first position 1P where the holder 30 is closest to the opening and a second position 2P where the holder 30 is substantially completely accommodated in the holder accommodating portion 61.

When the holder 30 is slid towards or to the first position 1P, one end of the holder 30 at an opening side projects from the opening of the base portion 60 so that the connector housing 20 can be at least partly inserted into the accommodating recess 34. When the holder 30 is slid towards or to the second position 2P, the surface of the base portion 60 with the opening (opening of the holder accommodating portion 61), the surface of the holder 30 with the opening (opening of the accommodating recess 34) and the surface of the connector housing 20 with the openings (openings of the terminal accommodating portions 21) particularly are substantially flush.

A holder pressing spring 63 for biasing the holder 30 toward the first position 1P is arranged between a spring recess 64 formed in a back wall 62 of the holder accommodating portion 61 of the base portion 60 and the holder 30, and supported on a spring guide 36 projecting from the lower surface of the holder 30 and at least partly inserted into a guide through hole 65 formed in the base portion 60. Thus, a locking portion 66 engageable with an engaging portion 37 provided in an intermediate part (particularly substantially in a central part) of an outer surface of the holder 30 is provided on an inner surface of the holder accommodating portion 61 to retain the holder 30 biased toward the first position in the holder accommodating portion 61.

On the other hand, a lock-portion accommodating recess 38 and a stopper accommodating recess 39 are formed in one surface substantially along the longer side of the holder 30 out of the surfaces of the holder 30 adjacent to the surface where the accommodating recess 34 is formed and/or held substantially in contact with the inner surfaces of the holder accommodating portion 61, and a detection-arm accommodating groove 40 and a retaining-portion accommodating groove 41 are formed in a substantially opposite surface of the holder 30.

The stopper accommodating recess 39 is at a position slightly displaced toward the lock accommodating recess 38 from the center of the holder 30 and has a substantially circular cross section and reach the detection-arm accommodating groove 40 located at the opposite side, and a cylindrical stopper 42 having a flange 42A formed at one end toward the detection-arm accommodating groove 40 is accommodated in the stopper accommodating recess 39 slidably in a direction at an angle, preferably substantially orthogonal to a sliding direction of the holder 30. A part of the stopper accommodating recess 39 is widened somewhat from its substantially central part to the detection-arm accommodating groove 40, and a stopper spring 43 supported on the stopper 42 for biasing the flange 42A toward the detection-arm accommodating groove 40 is provided or mounted in this widened part.

This stopper 42 is slidable between a non-restricting position where it is completely accommodated in the stopper accommodating recess 39 and a restricting position where it projects from the stopper accommodating recess 39 to retain the holder 30 at the second position 2P in the holder accommodating portion 61 by being pressed by the detection arm 32 from the side of the detection-arm accommodating groove 40, and particularly biased toward the non-restricting position by the stopper spring 43.

The detection-arm accommodating groove 40 is formed substantially straight from a position between an intermediate part of the holder 30 and the lower surface thereof to a position between the upper surface of the holder 30 to the intermediate part thereof and has a width slightly longer than the width of the detection arm 32, and a supporting shaft 44 for rotatably supporting the detection arm 32 in the detection-arm accommodating groove 40 is provided in a substantially central part of the detection-arm accommodating groove 40. At the bottom surface of the detection-arm accommodating groove 40, an end of the detection-arm accommodating groove 40 toward the accommodating recess 34 of the holder 30 communicates with the accommodating recess 34, and an end thereof toward the stopper accommodating recess 39 communicates with the stopper accommodating recess 39.

The detection arm 32 is a narrow and long box linking communicating openings with the accommodating recess 34 and the stopper accommodating recess 39 in the detection-arm accommodating groove 40, and a locking-piece contact 45 is provided at or near an end thereof toward the accommodating recess 34, and a locking-mechanism contact 46 (particularly including an adjustment bolt 46A and an adjustment nut 46B) is provided at or near an end thereof toward the stopper accommodating recess 39.

The detection arm 32 is supported pivotably by the supporting shaft 44 at least partly inserted through a shaft hole 32A formed in the width direction at a position of the detection arm 32 displaced toward the locking-piece contact 45 from the center, and is displaceable between an insufficient insertion detecting posture and a non-detecting posture according to projecting states of the locking pieces 23 of the housing 20 with the holder 30 located at the second position 2P.

Figure 11:
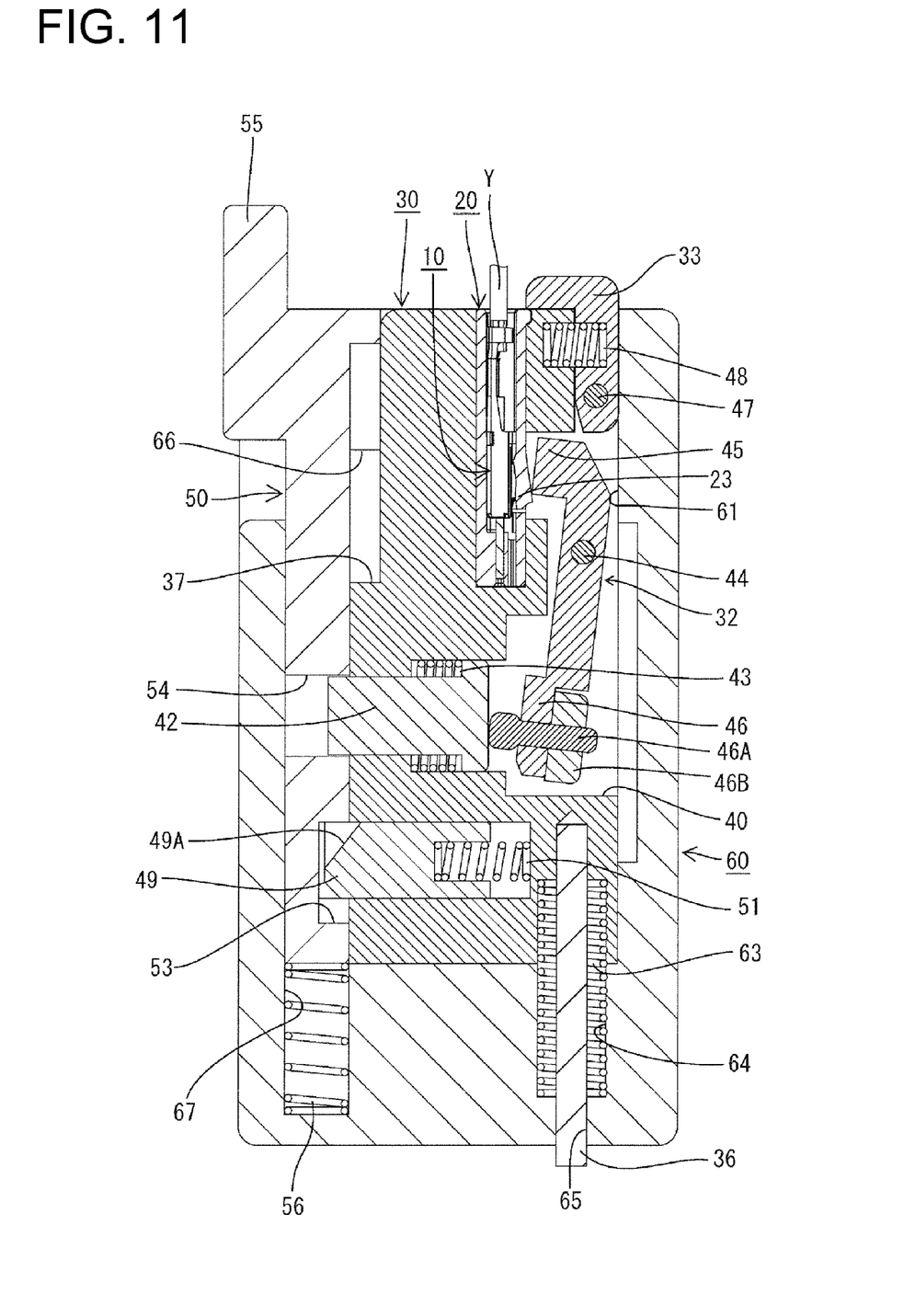
FIG. 11 is a side view in section showing the terminal fitting insufficiently inserted in the housing accommodated in the holder located at the second position.

Specifically, as shown in FIG. 11, when the terminal fitting 10 is insufficiently inserted in the housing 20, the locking piece 23 projects toward the detection-arm accommodating groove 40 from the accommodating recess 34 of the holder 30 to press the locking-piece contact portion 45, whereby the detection arm 32 rotates or pivots clockwise about the supporting shaft 44 to the insufficient insertion detecting posture to cross an extending directing of the accommodating recess 34. When the terminal fittings 10 are inserted up to the proper positions in the connector housing 20, the locking pieces 23 do not press the locking-piece contact 45 toward the detection-arm accommodating groove 40, the projecting surface of the locking-piece contact 45 extends substantially along the outer surface of the housing main body 22 and the detection arm 23 is in the non-detecting posture to substantially extend in parallel to the extending direction of the accommodating recess 34.

When the detection arm 32 is in the insufficient insertion detecting posture, the locking-mechanism contact 46 of the detection arm 32 pushes the biased stopper 46 out of the stopper accommodating recess 39 and causes the stopper 46 towards or to slide or displace to the restricting position, thereby retaining the holder 30 at the second position in the holder accommodating portion 61.

At this time, for example, the detection arm 32 particularly is set such that a dimension from the supporting shaft 44 to the locking-mechanism contact 46 is more than about twice, particularly about three times as long as a dimension from the supporting shaft 44 to the locking-piece contact 45. Thus, when a projecting amount of the locking piece 23 is transferred to the locking-piece contact 45 to displace the detection arm 32, this projecting amount is transferred to the locking-mechanism contact 46 while being multiplied (e.g. three-fold), wherefore the projecting state of the locking piece 23 can be detected more reliably.

The retainer accommodating groove 41 particularly substantially extends from the upper surface of the detection-arm accommodating groove 40 to the surface of the holder 30 where the opening of the accommodating recess 34 is formed, thereby being formed integrally to the detection-arm accommodating groove 40, and a substantially L-shaped retainer 33 is mounted in the retainer accommodating groove 41.

This retainer 33 has one end thereof rotatably or pivotably supported by a retainer supporting shaft 47 provided in the retaining-portion accommodating groove 41, and is displaceable between a locking posture for retaining the connector housing 20 at least partly accommodated in the accommodating recess 34 and an unlocking posture for enabling the connector housing 20 at least partly accommodated in the accommodating recess 34 to be taken out. A retainer spring 48 is mounted between the retainer 33 and the retainer accommodating groove 41 above the retaining-portion supporting shaft 47 and biases the retainer 33 in a direction at an angle, preferably substantially orthogonal to the inserting direction of the housing 20 to hold the retainer 33 in the unlocking posture.

Figure 9:
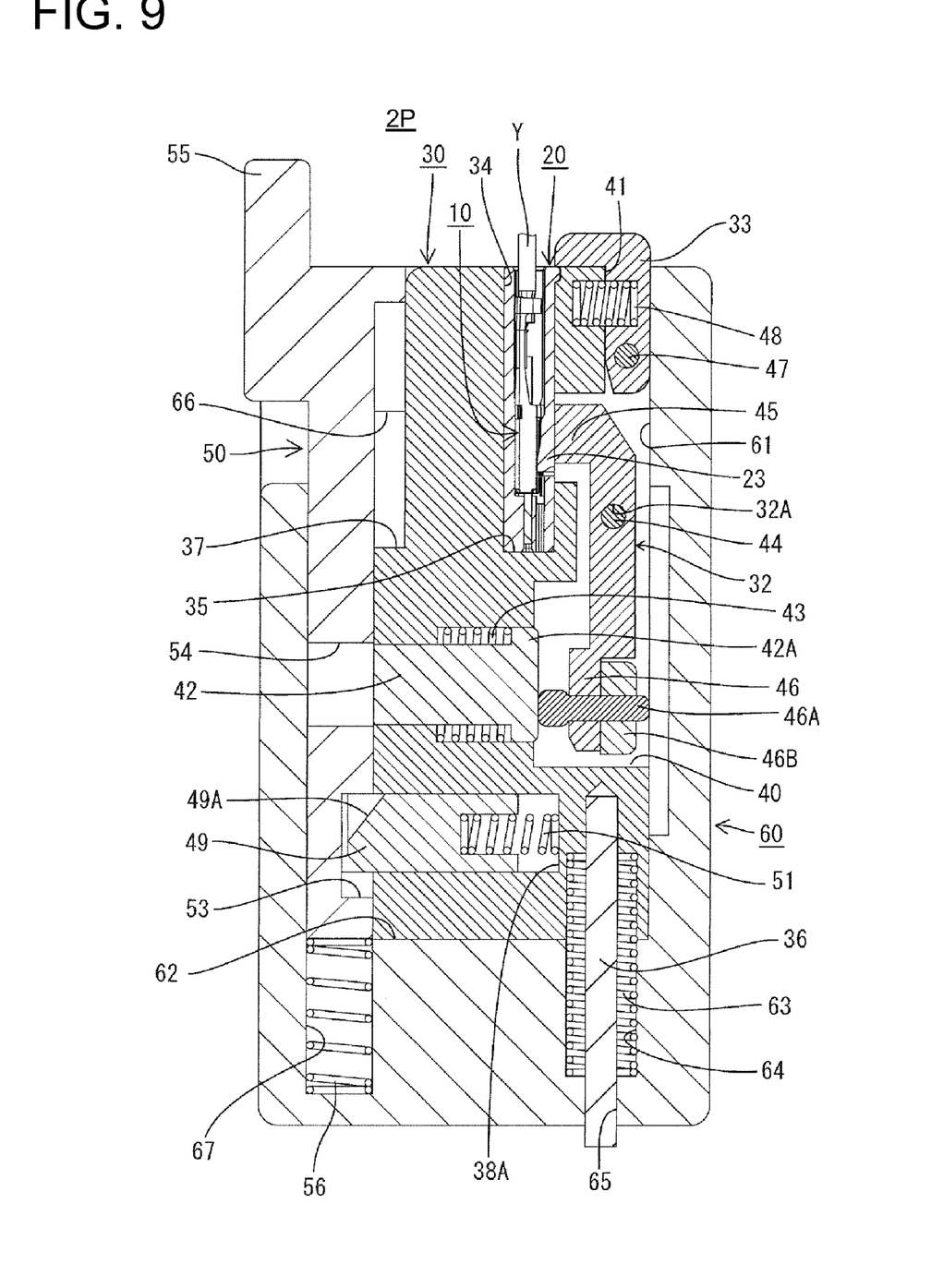
FIG. 9 is a side view in section showing the terminal fitting inserted to a proper position in the housing accommodated in the holder located at a second position.

Specifically, when the holder 30 is set to the second position 2P with the housing 20 inserted in the accommodating recess 34 of the holder 30, the retaining portion 33 is in the locking posture in which an L-shaped part thereof substantially is in contact with the surfaces where the retaining-portion accommodating groove 41 and the accommodating recess 34 are formed and a leading end of the retainer 33 locks the respective opening edges of the terminal accommodating portions 21 of the housing 20 inserted in the accommodating recess 34. When the holder 30 is set to the first position 1P, the retaining portion 30 particularly is pushed out of the retaining-portion accommodating groove 41 by the retaining portion spring 48 and set to the unlocking posture in which the housing 20 in the accommodating recess 34 can be taken out.

The lock accommodating recess 38 particularly is so formed at a position of the holder 30 somewhat displaced toward the center from the lower surface as to have the same rectangular cross section up to a position somewhat displaced toward the opposite surface from the center of the holder 30 in a shorter side direction, and a lock 49 particularly having a substantially rectangular parallelepipedic shape and/or including an unlock sliding portion 49A at its leading end is at least partly accommodated therein slidably in a direction at an angle different from 0° or 180°, preferably substantially orthogonal to the sliding direction of the holder 30.

This unlock sliding portion 49A particularly is formed to be inclined toward the lower surface of the lock 49 from a position somewhat displaced toward the center from the leading end of the lock 49 to the leading end.

This lock 49 particularly is slidable between a lock position where it projects from the lock-portion accommodating recess 38 to be engaged with an unlock portion 50 formed in the base portion 60 and an non-lock position where it is substantially completely accommodated in the lock-portion accommodating recess 38, and biased toward the lock position by a locking spring 51 arranged between the lock 49 and a back wall 38A of the lock-portion accommodating recess 38.

The unlock portion 50 particularly substantially has a narrow and long rectangular parallelepipedic shape and/or held in an unlock-portion accommodating portion 67 formed in the base portion 60. The unlock-portion accommodating portion 67 is formed integrally or unitarily to the holder accommodating portion 61 at the side of the surface of the holder 30 where the lock 49 and the stopper 42 are provided, substantially extends in the sliding direction of the holder 30 and/or is shaped substantially in conformity with the unlock portion 50.

The unlock portion 50 includes a lock main body 52 formed with an engaging recess 53 engageable with the lock 49 and having a substantially rectangular opening and an engaging groove 54 engageable with the stopper 42 and having a substantially circular opening, an unillustrated locking projection for retaining the unlock portion 50 in the holder accommodating portion 61, and a pressing portion 55 used to insert the unlock portion 50 into the holder accommodating portion 61, and is slidable substantially in the same direction as the holder 30.

The unlock portion 50 particularly includes the pressing portion 55 at a position projecting from the surface of the holder 30 where the accommodating recess 34 is formed, and this pressing portion 55 particularly is formed to slightly project from the base portion 60 toward a side substantially opposite to the holder 30. An unlocking spring 56 is mounted below the unlock portion 50, which is biased by the unlocking spring 56.

The unlock portion 50 is slidable substantially between a non-unlock position where it is biased by the unlocking spring 56 and the pressing portion 55 completely projects from the upper surface of the base 60 and an unlock position where the pressing portion 55 is pressed downwardly to insert the unlock portion 50 into the unlock-portion accommodating portion 67 and slightly projects from the upper surface of the base portion 60, and a sliding direction thereof is the same as that of the holder 30.

Here, when the unlock portion 50 is at the non-unlock position and the holder 30 is slid to the second position 2P, the engaging recess 53 and the engaging groove 54 of the lock main body 52 are arranged at positions substantially corresponding to the lock portion 49 and the stopper 42 of the holder 30, and the lock portion 49 biased by the locking spring 51 locks the holder 30 at the second position 2P at the lock position where it is engaged with the engaging recess 53.

In this state, when the one or more terminal fittings 10 are at least partly inserted into the housing 20 at least partly inserted in the accommodating recess 34 of the holder 30 and the detection arm 32 is brought to the insufficient insertion detecting posture by the locking piece(s) 23 of the housing 20, the stopper 42 is engaged with the engaging groove 54 to prevent a sliding movement of the unlock portion 50.

Figure 10:
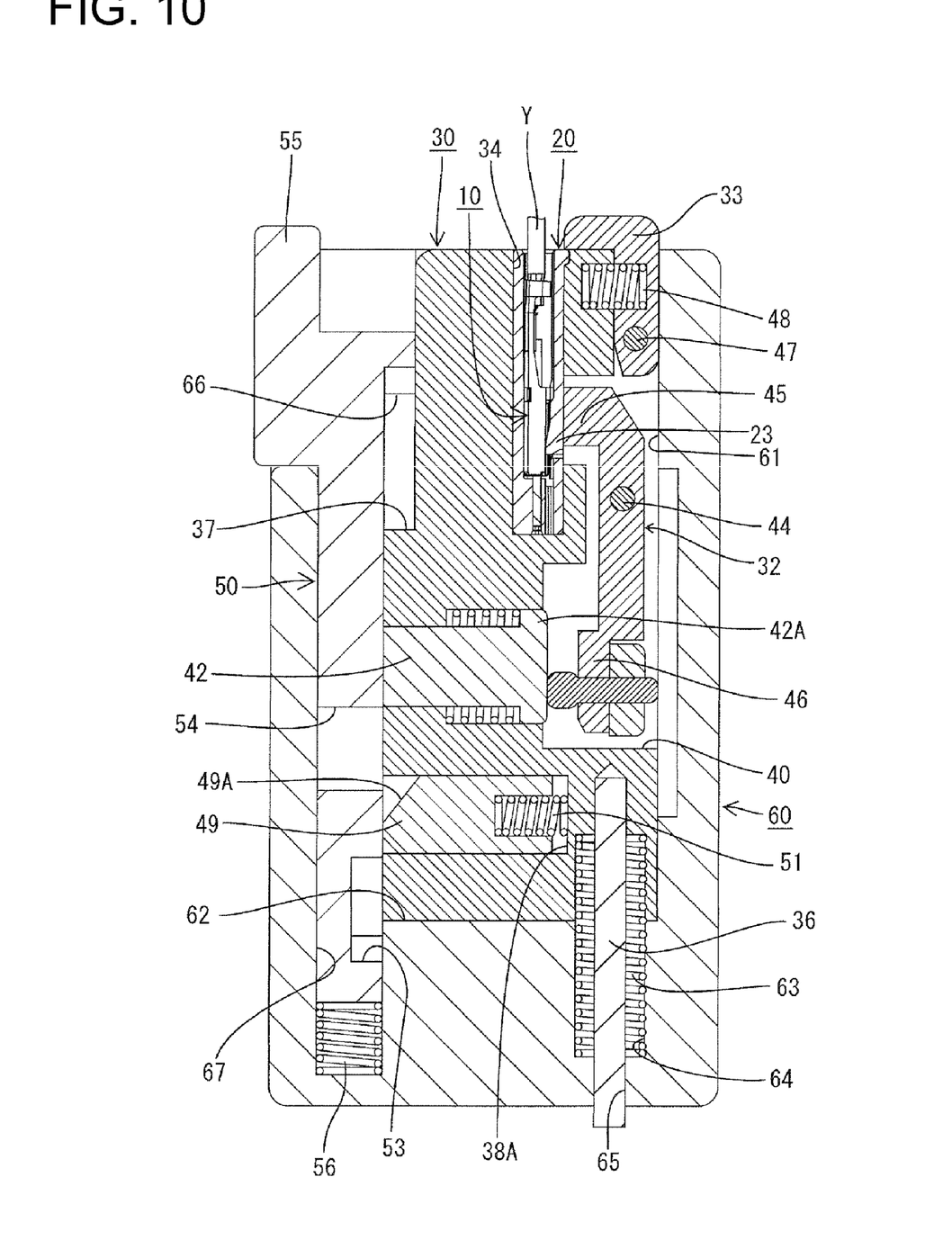
FIG. 10 is a side view in section showing a state where an unlock portion is located at an unlock position.

However, when the detection arm 32 is in the non-detecting posture, the stopper 42 is at the non-restricting position and the pressing portion 55 of the unlock portion 50 can be pressed downward or outward from above to slide the unlock portion 50 to the unlock position, the upper inner surface of the engaging recess 53 pushes the lock portion 49 into the lock-portion accommodating recess 38 to slide the lock portion 49 to the non-lock position while substantially sliding in contact with the unlock sliding portion 49A of the lock portion 49. In this way, the locked state of the holder 30 is canceled, the holder 30 is or can be slid from the second position 2P to the first position 1P and the retaining portion 33 engaged with the peripheral edge portion of the housing 20 is displaced to the unlocking posture, so that the housing 20 can be taken out from the accommodating recess 34.

Figure 6:
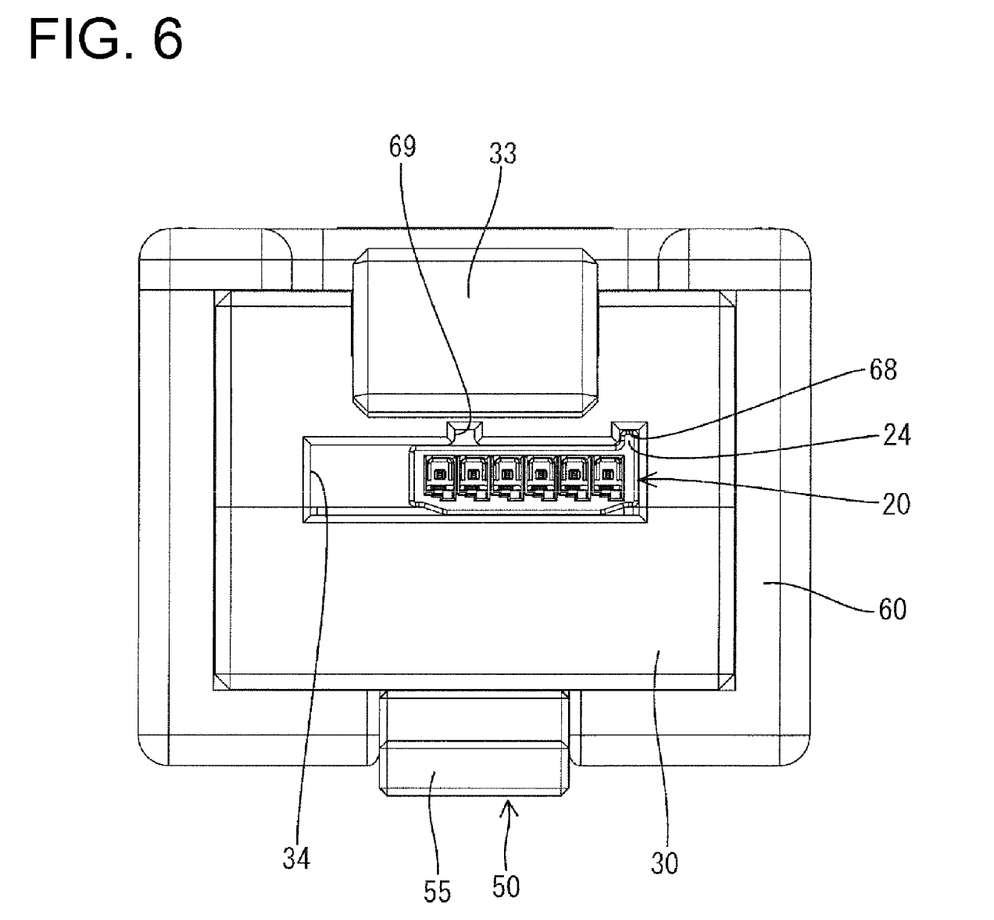
FIG. 6 is a front view showing a housing with six terminal accommodating portions inserted in the accommodating recess of the connector assembling jig.
Figure 7:
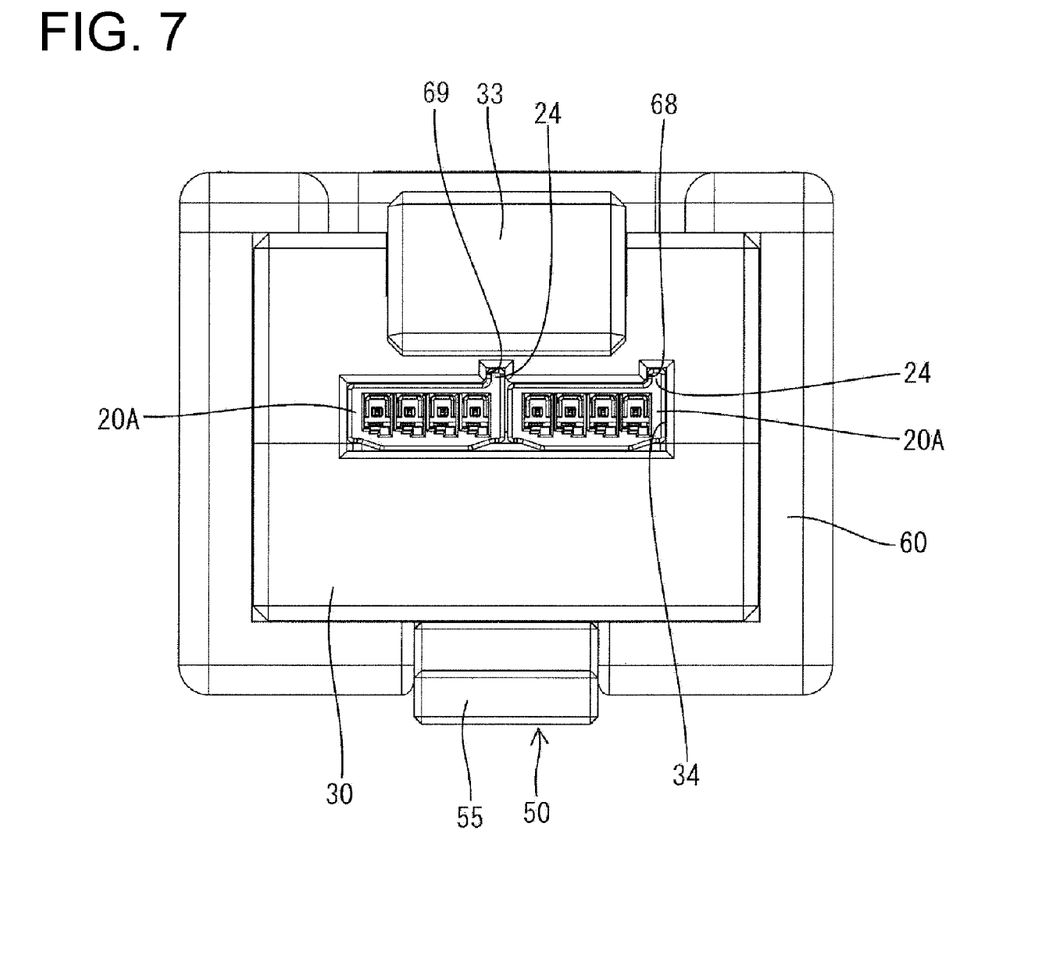
FIG. 7 is a front view showing a housing with four terminal accommodating portions inserted in the accommodating recess of the connector assembling jig.

As shown in FIGS. 5 to 7, the accommodating recess 34 formed in the holder 30 is formed with at least one positioning groove 68 in at least one inner surface (particularly substantially along the longer side of the opening thereof). This positioning groove 68 extends substantially straight from the opening of the accommodating recess 34 to the bottom wall 35 of the accommodating recess 34 in the inserting direction of the housing 20 and/or is shaped to include, at one end of the side surface along the longer side, an inner side surface substantially flush and continuous with and integral or unitary to the inner side surface along the short side. The depth of this groove is, for example, set to less than about half (e.g. at about ¼) of the thickness of the housing 20 to be inserted into the accommodating recess 34, and/or the width thereof is, for example, set to be more than the groove depth, e.g. at about 1.5-fold of the groove depth.

Specifically, the housing 20 having at least one positioning rib 24 formed on along the longer side and substantially continuous with and unitary to the side surface along the shorter side is inserted into the accommodating recess 34, and the side surface along the shorter side where the positioning rib 24 is provided particularly is set to be thicker than the housing 20, e.g. at about 1.3-fold of the thickness of the housing 20.

Thus, a housing 20 including one or more (e.g. eight) terminal accommodating portions 21, for example, as shown in FIG. 5 and to be at least partly inserted into the accommodating recess 34 of the holder 30 can be at least partly accommodated into the accommodating recess 34 by at least partly fitting or inserting and sliding at least one corresponding positioning rib 24 into and substantially along the respective at least one positioning groove 68 formed in the accommodating recess 34.

When the housing 20 is inserted correctly and completely into the accommodating recess 34, the outer side surface of the housing 20 where the positioning rib 24 is provided and the inner side surface of the accommodating recess 34 where the positioning groove 68 is provided are held in close contact. A surface contact area is higher (e.g. by about 1.3 times or more as large) as compared with the case where the positioning groove 68 is not provided.

A small connector assisting groove 69 having the same shape as the positioning groove 68 is formed in a longitudinal central part of the accommodating recess 34. Into this small connector assisting groove 69 is inserted at least one positioning rib 24 of a small housing 20A dimensioned particularly such that a side surface thereof opposite to the positioning rib 24 is held substantially in close contact with the inner side surface of the accommodating recess 34 substantially opposite to the one where the positioning groove 68 is formed when the connector housing 20A is at least partly inserted into the accommodating recess 34.

Accordingly, two small connectors can be simultaneously assembled by preparing two small connector housings 20A and at least partly inserting them while fitting positioning ribs 24 thereof into the positioning groove 68 and the small connector assisting groove 69 of the accommodating recess 34.

The base 60 of the connector assembling jig is fixed or held to or positioned on a work table and, as shown in FIG. 8, the housing 20 including the positioning rib 24 is at least partly inserted into the accommodating recess 34 with the holder 30 held at the first position 1P. Subsequently, the holder 30 having the housing 20 inserted therein is pushed into the holder accommodating portion 61 of the base portion 60 and the holder 30 is slid or displaced towards or to the second position 2P. At this time, the lock portion 49 is engaged with the engaging recess 53 of the unlock portion 50 to lock the holder 30 at the second position 2P and the retaining portion 33 is set to the locking posture to lock the peripheral edge portion of the housing 20. In this way, the housing 20 is retained in the accommodating recess 34.

In this state, as shown in FIG. 9, the terminal fittings 10 are inserted to the proper positions into the one or more terminal accommodating portions 21 of the housing 20. Here, since the one or more terminal fittings 10 are at the proper positions, the one or more locking pieces 23 of the connector housing 20 do not project from the outer surface of the housing 20 and the detection arm 32 is in the non-detecting posture. In this state, as shown in FIG. 10, the pressing portion 55 of the unlock portion 50 is pushed to slide the unlock portion 50 to the unlock position, whereby the upper surface of the engaging recess 53 pushes the lock portion 49 into the lock-portion accommodating recess 38 to slide or displace the lock portion 49 to the non-lock position substantially while substantially sliding in contact with the unlock sliding portion 49A. Then, the holder 30 locked or positioned at the second position 2P by the lock portion 49 is slid or displaced toward or to the first position 1P particularly by a biasing force of the holder pressing spring 63 and the housing 20 can be taken out from the accommodating recess 34 of the holder 30.

In this way, an operator can confirm that the one or more terminal fittings 10 were inserted to the proper positions in the respective terminal accommodating portions 21. Then, the completed connector is taken out and a connector assembling operation can be performed by repeating the above operation.

However, if the terminal fitting 10 is not inserted to the proper position and left insufficiently inserted as shown in FIG. 11, the respective locking piece 23 projects from the outer surface of the housing 20 to push the locking-piece contact portion 45 of the detection arm 32 and the detection arm 32 is displaced toward the insufficient insertion detecting posture. Then, the locking-mechanism contact portion 46 of the detection arm 32 pushes the stopper 42 from the side of the detection-arm accommodating groove 40 toward the unlock portion 50, whereby the stopper 42 is engaged with the engaging groove 54, making it impossible to slide the unlock portion 50 at the non-lock position. The operator can confirm that the terminal fitting 10 is insufficiently inserted in the terminal accommodating portion 21 by noticing that the unlock portion 50 cannot be operated.

As described above, in this embodiment, resilient deformations of the locking pieces 23 of the housing 20 are important to indicate insufficiently inserted states of the terminal fittings 10, and it is a serious problem in detecting the inserted states of the terminal fittings that the projecting amounts of the locking pieces 23 increase or decrease from a detectable standard.

In this respect, when the housing 20 including the positioning rib 24 is completely inserted into the accommodating recess 34 including the positioning groove 68, the outer side surface of the housing 20 where the positioning rib 24 is provided and the inner side surface of the accommodating recess 34 where the positioning groove 68 is provided are largely in contact, wherefore the housing 20 can be prevented from shaking by being inclined in the width direction and the shaking of the housing 20 when the terminal fittings 10 are assembled into the housing 20 can also be dealt with.

Even a connector housing 20 at least partly insertable into the accommodating recess 34, having a width shorter than a predetermined width and including fewer terminal accommodating portions 21, e.g. a connector housing 20 including six terminal accommodating portions as shown in FIG. 6 can be prevented from shaking by fitting a positioning rib 24 thereof into the positioning groove 68 of the accommodating recess 34. The jig of this embodiment can be commonly used for assembling connectors with fewer terminal accommodating portions.

Further, when a plurality of (e.g. two) small connector housings 20A are or may be simultaneously inserted into the accommodating recess 34 by at least partly fitting or inserting the positioning ribs 24 thereof into the at least one positioning groove 68 and the at least one small connector assisting groove 69, the small connector housing 20A having the positioning rib 24 at least partly inserted into the positioning groove 68 is prevented from shaking for the reason mentioned above and the one having the positioning rib 24 at least partly inserted into the small connector assisting groove 69 can be prevented from shaking by the close contact of the side surface opposite to the one where the positioning rib 24 is provided with the inner side surface of the accommodating recess 34 substantially opposite to the one where the positioning groove 69 is provided.

As described above, in this embodiment, the shaking of the connector housing 20 inserted into the accommodating recess 34 can be prevented not only when the connector housing 20 includes a predetermined number of terminal accommodating portions, but also when the connector housing 20 includes fewer terminal accommodating portions than the predetermined terminal accommodating portions. Thus, the projecting amounts of the locking pieces 23 can be prevented from increasing or decreasing from the predetermined standard, wherefore the insufficiently inserted states of the terminal fittings can be more accurately detected.

The invention is not limited to the above described and illustrated embodiment. For example, the following embodiments also are included in the scope of the invention.

In the above embodiment, the depth of the positioning groove 68 of the accommodating recess 34 is about ¼ of the thickness of the connector housing 20 to be inserted into the accommodating recess 34. However, the present invention is not limited to such a mode and the depth of the positioning groove 68 may be larger than ¼ of the thickness of the connector housing 20.

Although the accommodating recess 34 is formed with the small connector assisting groove 69 in the above embodiment, the invention is not limited to such a mode and the accommodating recess 34 may have no small connector assisting groove.

What is claimed is:

1. A connector assembling jig which is to be used to determine whether terminal fittings have been inserted to proper positions in a housing, the housing including a main body with terminal accommodating portions and locking pieces for locking and retaining the terminal fittings inserted respectively to the proper positions in the terminal accommodating portions and formed so that each locking piece projects out from one side surface of the main body if the corresponding terminal fitting is inserted insufficiently in the terminal accommodating portion, and holds the housing and enables detection of insufficient insertion of the terminal fittings when the terminal fittings are inserted into the housing, the jig comprising:

a base formed with a holder accommodating portion;

a holder including an accommodating recess for accommodating and positioning the housing, the holder being mounted in the base and being slidable therein along a sliding direction between a first position where the holder is partially inserted into the holder accommodating portion and a second position where the holder is fully inserted into the holder accommodating portion;

an insufficient insertion detection arm supported in the holder for rotation about a supporting shaft transverse to the sliding direction so that the detection arm is displaceable between an insufficient insertion detecting state for locking the holder at the second position when any locking piece of the housing projects out from the one side surface of the main body and a non-detecting posture enabling the holder to slide toward the first position;

at least one positioning groove formed in an inner side surface of the accommodating recess and adapted to receive at least one positioning rib projecting in a thickness direction of the housing, an inner surface of the positioning groove being substantially flush and continuous with an inner side surface of the accommodating recess adjacent to the inner side surface where the positioning groove is formed.

2. The connector assembling jig of claim 1, wherein the positioning groove extends in the longitudinal direction of the housing from the an opening edge of the accommodating recess.

3. The connector assembling jig of claim 1, wherein at least one small connector assisting groove having the same shape as the positioning groove is provided in a central part of the inner side surface of the accommodating recess where the positioning groove is formed.

4. The connector assembling jig of claim 1, wherein the connector assembling jig further comprises a locking mechanism provided from the holder to the base for locking the holder at the second position when the detection arm is in the detecting posture, and enables the holder to slide to the first position when the detection arm is in the non-detecting posture.

5. The connector assembling jig of claim 1, wherein the detection arm includes a locking-piece contact portion at one longitudinal end of the detection arm and projecting toward the accommodating recess and a locking-mechanism contact portion that acts on the locking mechanism depending on the detecting posture at an end of the detection arm opposite the locking piece contact portion.

6. The connector assembling jig of claim 5, wherein a dimension from the supporting shaft to the locking-mechanism contact portion exceeds a dimension from the supporting shaft to the locking-piece contact portion.

7. The connector assembling jig of claim 5, wherein the locking mechanism includes a lock in the holder and slidable in a direction crossing a the sliding direction of the holder between a lock position where the lock engages an engaging recess formed in the base to lock the holder at the second position when the holder is slid to the second position and a non-lock position where the lock is disengaged from the engaging recess to unlock the holder.

8. The connector assembling jig of claim 7, wherein the locking mechanism further includes an unlock portion provided in the base and slidable in the substantially same direction as the holder between an unlock position where the unlock portion slides in contact with an unlock sliding portion at the leading end of the lock to slide the lock in a direction substantially opposite to an engaging direction with the engaging recess, thereby disengaging the engaging recess and the lock, and a non-unlock position where the unlock portion is fixed in the base and holds the lock and the engaging recess in a locked state.

9. The connector assembling jig of claim 8, wherein the locking mechanism includes a stopper in the holder and slidable in substantially parallel to the lock between a restricting position where the stopper is engaged with an engaging groove formed in the base and restricts the unlock portion at the non-unlock position by being pushed by the detection arm when the detection arm is in the detecting posture and a non-restricting position where the stopper is disengaged from the engaging groove to free the unlock portion.

10. The connector assembling jig of claim 9, wherein a stopper biasing member is supported on the stopper for biasing stopper toward a detection-arm accommodating groove of the holder.

11. The connector assembling jig of claim 1, wherein the holder includes a retainer for retaining the housing inserted in the holder when the holder is at the second position.

12. The connector assembling jig of claim 1, wherein the positioning groove has a depth which is set to less than about half of a thickness of the housing to be inserted into the accommodating recess, and the width of the positioning groove is set to be more than a depth of the positioning groove.

* * * * *